United States Patent
Ichikawa et al.

(10) Patent No.: US 11,004,787 B2
(45) Date of Patent: May 11, 2021

(54) SEMICONDUCTOR CHIP

(71) Applicant: Toshiba Memory Corporation, Tokyo (JP)

(72) Inventors: Masaya Ichikawa, Yokkaichi Mie (JP);
Takashi Sugihara, Yokkaichi Mie (JP);
Kaito Shirai, Nagoya Aichi (JP);
Satoshi Kotomari, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/558,391

(22) Filed: Sep. 3, 2019

(65) Prior Publication Data

US 2020/0266144 A1     Aug. 20, 2020

(30) Foreign Application Priority Data

Feb. 18, 2019   (JP) .............................. JP2019-026286

(51) Int. Cl.
| | | |
|---|---|---|
| H01L 23/522 | (2006.01) | |
| H01L 23/48 | (2006.01) | |
| H01L 23/528 | (2006.01) | |
| H01L 27/11582 | (2017.01) | |
| H01L 27/11565 | (2017.01) | |

(52) U.S. Cl.
CPC ........ *H01L 23/5226* (2013.01); *H01L 23/481* (2013.01); *H01L 23/5283* (2013.01); *H01L 27/11565* (2013.01); *H01L 27/11582* (2013.01)

(58) Field of Classification Search
CPC ............... H01L 23/5226; H01L 23/481; H01L 23/5283; H01L 27/11565; H01L 27/11582
USPC ........................................................ 257/773
See application file for complete search history.

(56) References Cited

U.S. PATENT DOCUMENTS

| | | | |
|---|---|---|---|
| 6,065,141 | A | 5/2000 | Kitagawa |
| 6,566,654 | B1 | 5/2003 | Funatsu et al. |
| 9,214,238 | B2 | 12/2015 | Futatsuyama et al. |
| 10,204,692 | B1 | 2/2019 | Kamata et al. |
| 2017/0103993 | A1* | 4/2017 | Lee ..................... H01L 23/5226 |
| 2017/0271349 | A1 | 9/2017 | Miyagawa et al. |
| 2018/0233185 | A1 | 8/2018 | Futatsuyama |

FOREIGN PATENT DOCUMENTS

| | | |
|---|---|---|
| JP | 2013-026406 A | 2/2013 |
| JP | 2017-174866 A | 9/2017 |
| TW | 201631590 A | 9/2016 |
| TW | 201738965 A | 11/2017 |
| TW | 201841264 A | 11/2018 |
| TW | I649752 B | 2/2019 |

* cited by examiner

Primary Examiner — Tong-Ho Kim
(74) Attorney, Agent, or Firm — Kim & Stewart LLP

(57) ABSTRACT

A semiconductor chip includes a memory cell array and a wiring layer. The memory cell array includes a plurality of blocks arranged in a first direction along a surface of the semiconductor chip. The wiring layer includes a plurality of first pattern regions at different positions along the first direction, each first pattern region including a different pattern corresponding to one or more of the blocks. The first pattern regions can be used to identify portions of the semiconductor chip during analysis or the like.

20 Claims, 12 Drawing Sheets

US 11,004,787 B2

SEMICONDUCTOR CHIP

CROSS-REFERENCE TO RELATED APPLICATION

This application is based upon and claims the benefit of priority from Japanese Patent Application No. 2019-026286, filed on Feb. 18, 2019, the entire contents of which are incorporated herein by reference.

FIELD

Embodiments described herein relate generally to a semiconductor chip.

BACKGROUND

A semiconductor chip including a memory cell array and a wiring layer is known. The memory cell array includes a plurality of memory blocks arranged in a predetermined direction.

DETAILED DESCRIPTION

Figure 1:
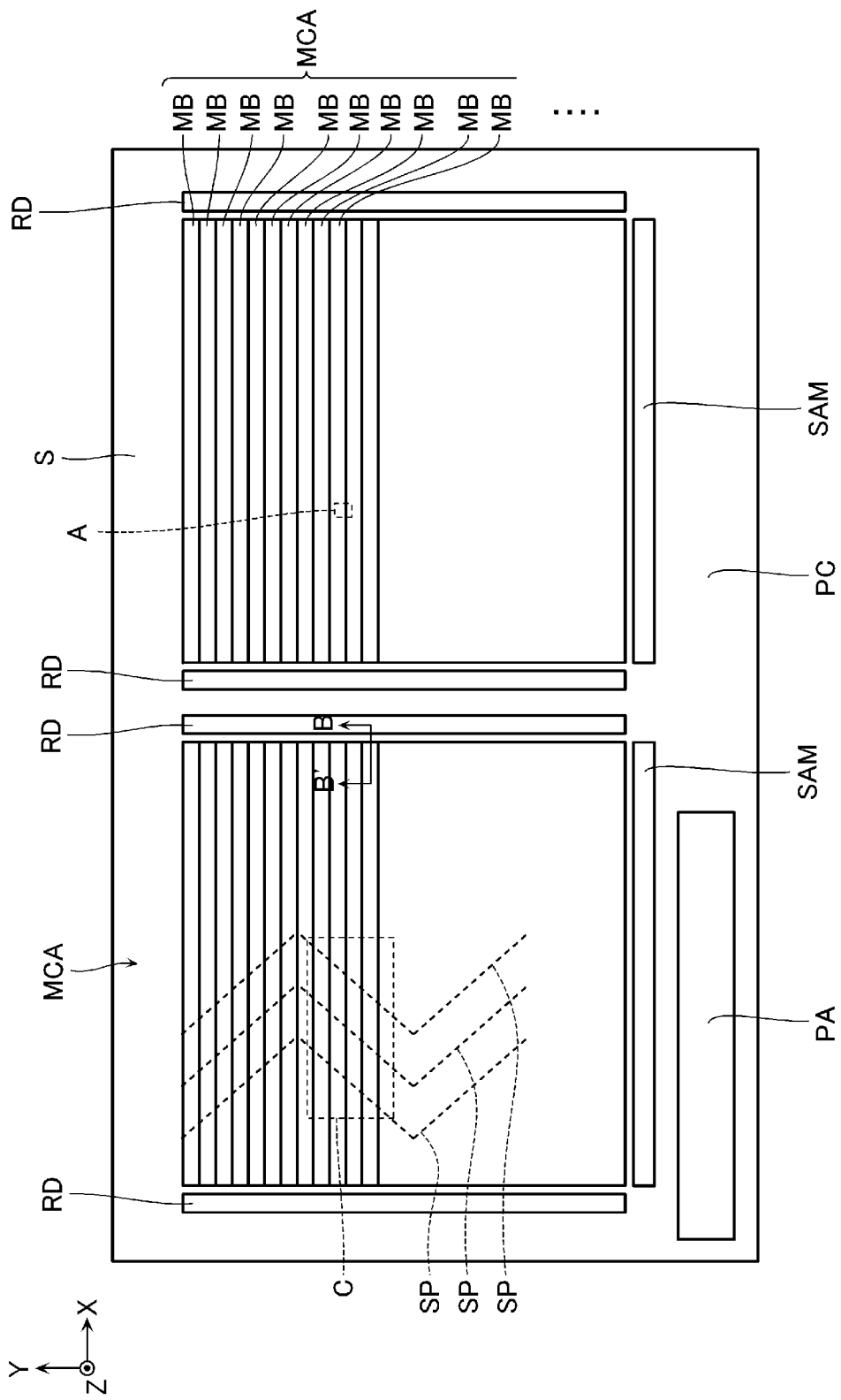
FIG. 1 illustrates a schematic plan view of a semiconductor chip according to a first embodiment.

In general, according to an embodiment, a semiconductor chip includes a memory cell array and a wiring layer. The memory cell array includes a plurality of blocks arranged in a first direction along a surface of the semiconductor chip. The wiring layer includes a plurality of first pattern regions at different positions along the first direction, each first pattern region including a different pattern corresponding to one or more of the blocks.

In general, according to an embodiment, a semiconductor chip includes a memory cell array including a plurality of blocks arranged in a first direction and a plurality of wirings extending in the first direction and arranged in a second direction intersecting the first direction. Wirings in the plurality of wirings each include a plurality of pattern regions that are different at positions along the second direction. The plurality of pattern regions each including identification patterns that are different from each other.

Example embodiments provide positional identifications of chip regions/elements/aspects which can be of use when semiconductor chips are analyzed or evaluated as part of manufacturing process or the like.

Next, semiconductor chips according to example embodiments will be described with reference to drawings. The following are merely examples and are not limiting of the present disclosure. Each of the drawings is schematic, and certain aspects of configuration may be omitted. Further, the same reference numerals may be assigned to components common to different embodiments, and the repeated descriptions thereof may be omitted.

Further, in the present disclosure, one direction that is parallel to a surface of a substrate is referred to a "X direction," another direction that is parallel to the surface of the substrate and perpendicular to the X direction is referred to a "Y direction," and a direction that is orthogonal to the surface of the substrate is referred to as a "Z direction."

Furthermore, one direction along a surface may be referred to as a "first direction," another direction that intersects the first direction along the surface may be referred to as a "second direction," and a direction that intersects the surface may be referred to as a "third direction." The first direction, the second direction, and the third direction may or may not correspond to any of the X direction, the Y direction, and the Z direction.

First Embodiment

FIG. 1 illustrates a schematic plan view of a semiconductor chip according to the present embodiment. The semiconductor chip according to the embodiment includes a substrate S. Two memory cell arrays MCA are arranged on the substrate S along the X direction. Each memory cell array MCA includes memory blocks MB arranged along the Y direction. Further, in a region outside of the memory cell arrays MCA, a row decoder RD extends in the Y direction at each X direction end of the memory cell arrays MCA, and a sense amplifier module SAM extends in the X direction at a Y direction end of each of the memory cell arrays MCA. Further, in the vicinity of an edge of substrate S, a pad area PA is provided. In the pad area PA, a plurality of pad electrodes is provided. In the regions outside the memory cell arrays MCA, other peripheral circuits PC are provided on the substrate S.

Figure 2:
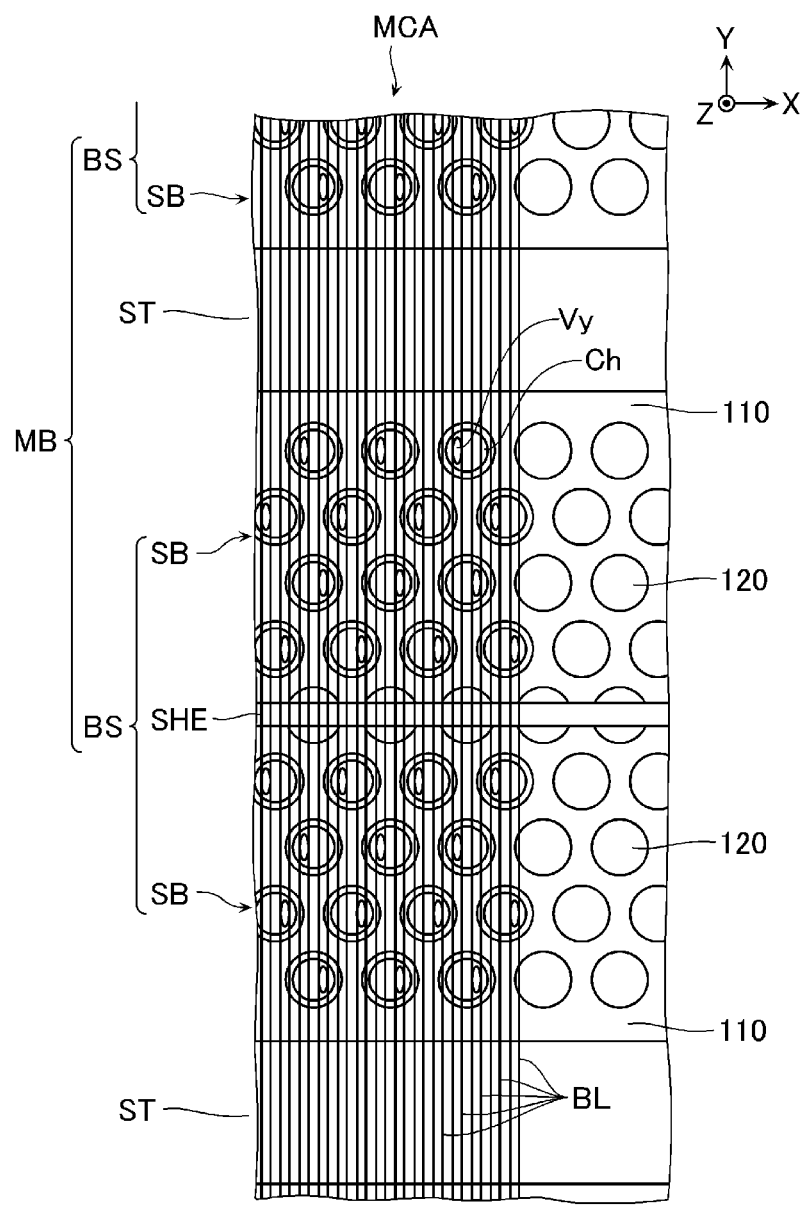
FIG. 2 illustrates an enlarged view of a region "A" in FIG. 1.

FIG. 2 illustrates an enlarged view of a region indicated as "A" in FIG. 1. As illustrated, each memory block MB includes two block structures BS arranged in the Y direction. An inter-block structure insulating portion ST is provided between the two block structures BS in the Y direction. Each block structure BS includes two sub blocks SB arranged in the Y direction. An inter-sub block structure insulating portion SHE is provided between the two sub blocks SB in the Y direction. Further, each block structure BS includes a conductive layer 110, and a plurality of semiconductor layers 120 arranged in a staggered manner. Further, FIG. 2 illustrates a plurality of bit lines BL that are arranged in the X direction and extend in the Y direction. Each bit line BL extends in the Y direction, and is connected to one semiconductor layer 120 that belongs to each sub block SB.

Figure 3:
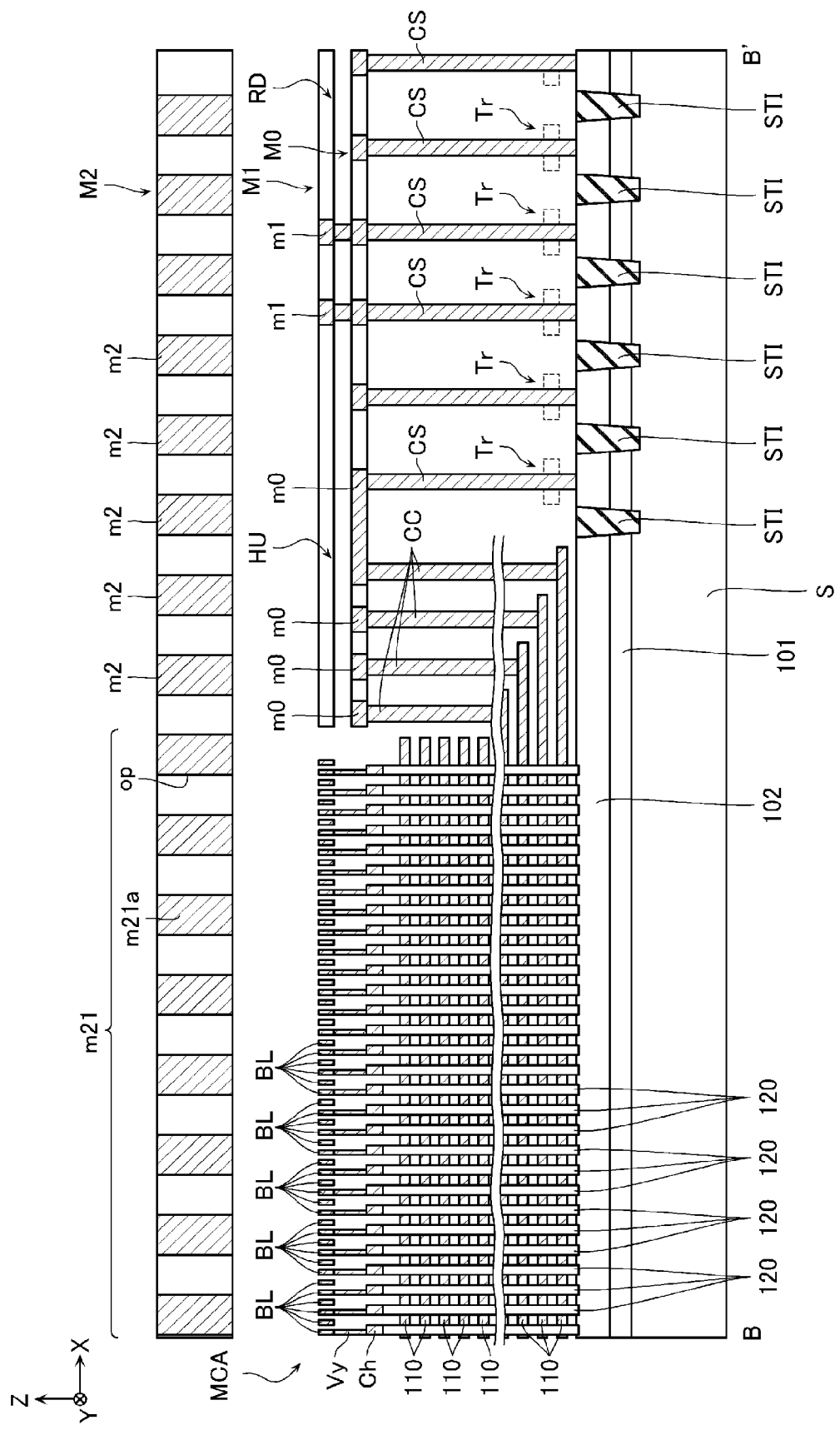
FIG. 3 illustrates a schematic cross-sectional view corresponding to line B-B' in FIG. 1.

FIG. 3 illustrates a schematic cross-sectional view of the structure illustrated in FIG. 1 cut along line B-B', and viewed in the direction of the arrow.

The semiconductor chip according to the embodiment includes the substrate S, a memory cell array MCA provided on the substrate S, a row decoder RD, and a hook up HU that connects the memory cell array MCA and the row decoder RD. Further, the semiconductor chip according to the embodiment includes wiring layers M0, M1, and M2.

The substrate S is, for example, a semiconductor substrate of single crystal silicon containing a P-type impurity. An N-type well 101 containing an N-type impurity is provided on an upper surface of the substrate S. A P-type well 102 containing the P-type impurity is provided on an upper surface of the N-type well 101. Further, an insulating portion STI is provided on the upper surface of the substrate S.

The memory cell array MCA includes a plurality of conductive layers 110 arranged in the Z direction, and a plurality of semiconductor layers 120 that extend in the Z direction. Each conductive layer 110 contains, for example, tungsten (W) or the like, and functions as a word line WL and a gate electrode of a memory transistor. The semiconductor layer 120 contains, for example, polycrystalline silicon (Si) or the like, and functions as a channel region of the memory transistor. In the illustrated example, a lower end of the semiconductor layer 120 is connected to the P-type well 102 of the substrate S. Furthermore, in general, a gate insulating film (not illustrated) is provided between the conductive layer 110 and the semiconductor layer 120. The gate insulating film comprises, for example, an insulating charge storage film of silicon nitride ($Si_3N_4$), a floating gate of polycrystalline silicon that contains an impurity, or a memory portion capable of recording/storing data.

The row decoder RD includes a plurality of transistors Tr arranged in the X direction, and a plurality of contacts CS connected to the transistors Tr. Each transistor Tr is an N-type field effect transistor in which the P-type well 102 is serving as the channel region. A contact CS extends in the Z direction, and is connected to a source region, a drain region, and the gate electrode of the transistor Tr.

The hook up HU (hookup region HU) includes ends of the plurality of conductive layers 110 and a plurality of contacts CC connected to these ends. Positions of the ends of the plurality of conductive layers 110 in the X direction are different from each other. Each contact CC extends in the Z direction, and is connected to one of the plurality of conductive layers 110.

The wiring layer M0 includes a plurality of wirings m0. A wiring m0 comprises, for example, tungsten (W) or the like. The wiring m0 connects, for example, a contact CC and a contact CS.

The wiring layer M1 is provided above the wiring layer M0, and includes a plurality of wirings m1. A wiring m1 comprises, for example, copper (Cu) or the like. The wiring m1 connects, for example, a contact CC and a contact CS. Further, a part of the wiring m1 functions as the bit line BL, and is connected to an upper end of the semiconductor layer 120 via a contact Vy (inter-level contact) and a contact Ch.

The wiring layer M2 is provided above the wiring layer M1, and includes a plurality of wirings m2. A wiring m2 contains, for example, aluminum (Al) or the like. A part of the wiring m2 is provided in the pad area PA (FIG. 1), and functions as a pad electrode. Further, a part of the wiring m2 is connected to the pad electrode, and supplies a signal, a power supply voltage, or a ground voltage. For example, a wiring m21 among the plurality of wirings m2 is provided above the memory cell array MCA, and supplies the ground voltage to the memory cell array MCA or the like.

Figure 4:
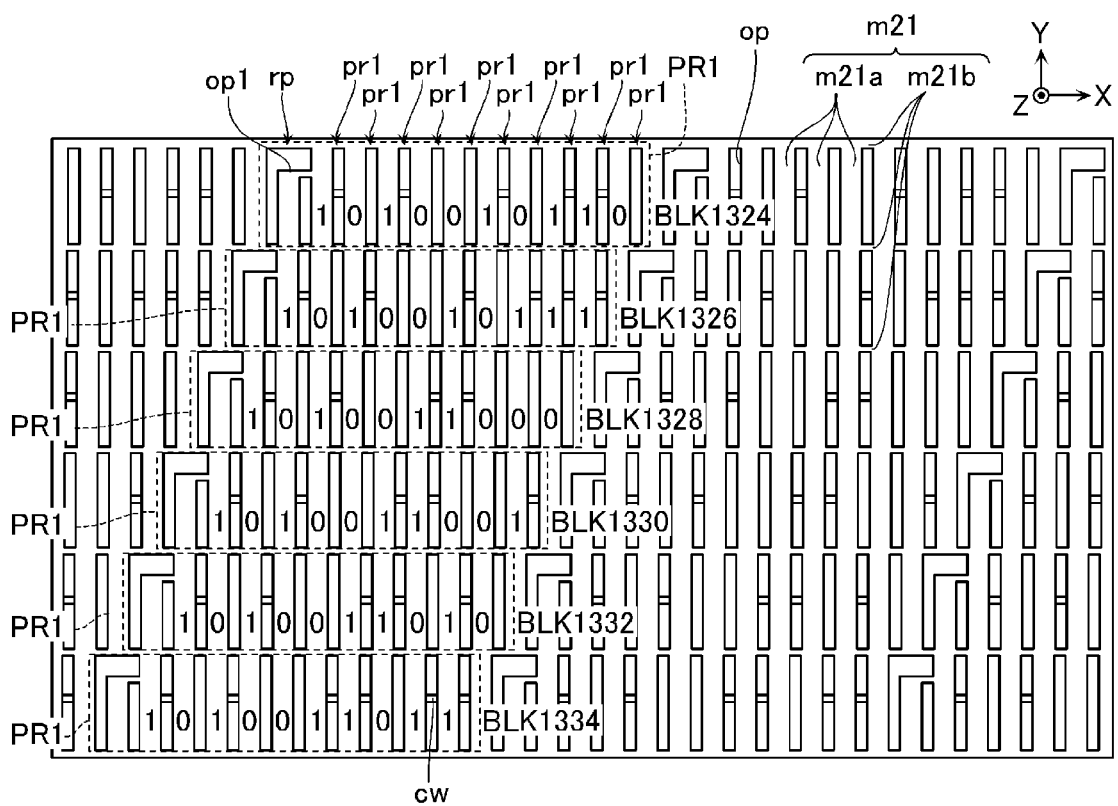
FIG. 4 illustrates an enlarged view of region "C" in FIG. 1.

FIG. 4 illustrates an enlarged plan view corresponding to a region indicated as "C" in FIG. 1, and illustrating a part of the wiring m21 provided above the memory cell array MCA.

A shape of the wiring m21 may be considered as substantially a net-like shape, and may also be considered as substantially a plate-like shape having a plurality of through via holes. When the shape of the wiring m21 is considered as substantially the net-like shape, the wiring m21 includes a plurality of wiring portion m21a that are arranged in the X direction and extend in the Y direction, and a plurality of wiring portions m21b that are arranged in the Y direction and extend in the X direction. The plurality of wiring portions m21a and m21b intersect each other to form substantially the net-like shape. When the shape of the wiring m21 is considered as substantially the plate-like shape, the wiring m21 includes a plurality of through via holes op arranged in the X direction and the Y direction. Some of the through via holes op1 among the plurality of through via holes op are larger than the other through via holes op. Such through via holes op1 are arranged in an oblique direction (a direction angled between the X direction and the Y direction) in the XY plane. Such through via holes op1 are provided, for example, along a serpentine pattern SP as illustrated in FIG. 1. The serpentine patterns SP may serve, for example, as a standard for specifying an address of the memory block MB when analyzing a semiconductor device.

Further, as illustrated in FIG. 4, the wiring m21 includes a plurality of pattern regions PR1 provided corresponding to one or more of the memory blocks MB. In the illustrated example, a pattern region PR1 is provided corresponding to the two adjacent memory blocks MB in the Y direction. The pattern region PR1 is provided at a position which overlaps with the corresponding two memory blocks MB, when viewed in the Z direction.

The pattern region PR1 includes a small pattern region rp, and a plurality of small pattern regions pr1 arranged in the X direction.

The small pattern region rp includes a reference pattern. The reference pattern includes a pattern that is different from the pattern in the plurality of small pattern regions pr1. As a result, a location range of the small pattern region rp may be specified. In the illustrated example, the reference pattern includes the through via hole op1. Further, in the illustrated example, the reference pattern has an arbitrary shape in the Y direction. As a result, a direction in the Y direction may be specified.

The plurality of small pattern regions pr1 are each provided with a pattern indicating "0" or a pattern indicating "1". In the illustrated example, a connection wiring cw is provided in some of the through via holes op. In the illustrated example, the through via hole op in which the connection wiring cw is not provided refers to the pattern indicating "0," and the through via hole op in which the connection wiring cw is provided refers to the pattern indicating "1." In the illustrated example, ten-digit binary numbers are represented by the ten small pattern regions pr1, thereby forming a pattern representing a specific address of each memory block MB. The addresses of the memory blocks MB represented in each pattern region PR1 along the Y direction are all different from each other. Therefore, the patterns in each different pattern region PR1 along the Y direction are all different from each other.

In such a configuration, the patterns in the pattern region PR1 are all different according to position along the Y direction. According to such a structure, for example, when a part of the semiconductor chip is cut off (sectioned) for performing analysis, it is possible to easily identify which specific memory block(s) MB corresponds to the portion being observed/analyzed.

Further, the wiring m21 has substantially a net-like shape or a plate-like shape. Thus, it is possible to relatively easily form a pattern for the wiring m21.

Second Embodiment

Figure 5:
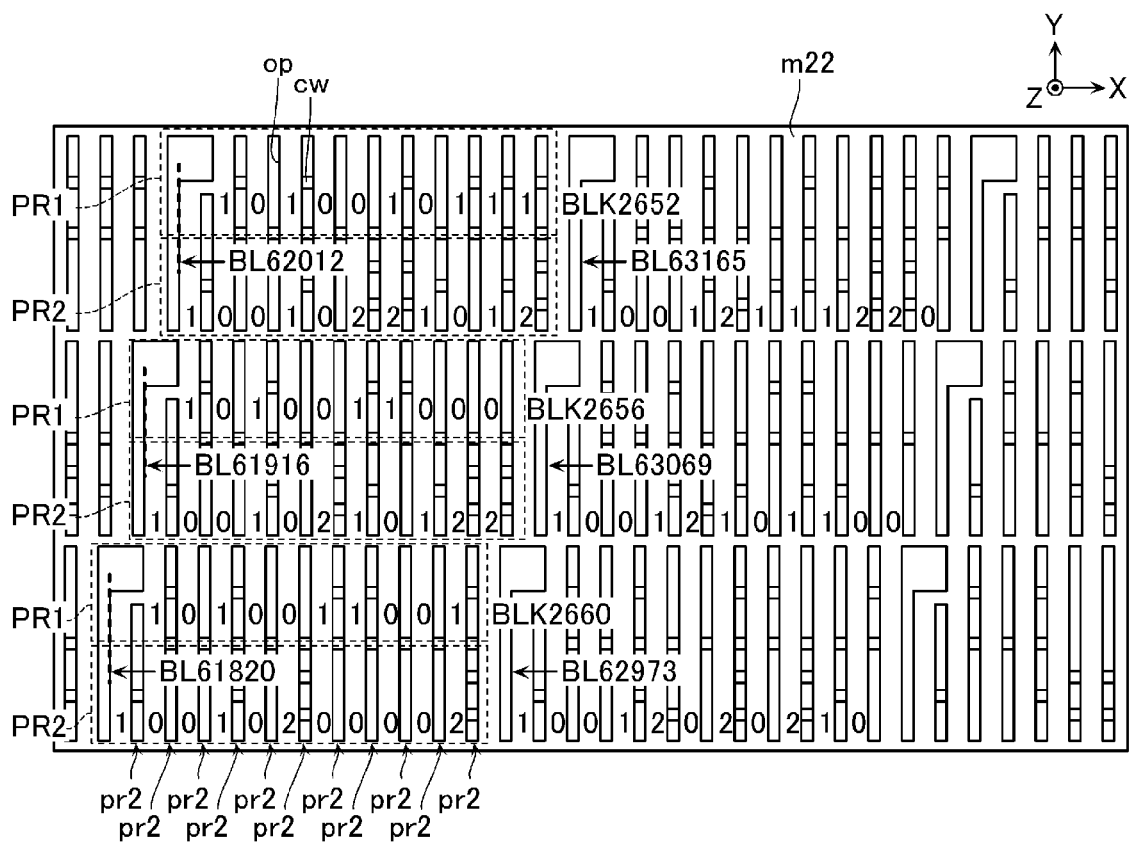
FIG. 5 illustrates a schematic plan view of a semiconductor chip according to a second embodiment.

FIG. 5 illustrates a plan view illustrating a configuration of a part of a semiconductor chip according to a second embodiment.

The semiconductor chip according to the second embodiment is basically configured in the same manner as the semiconductor chip according to the first embodiment, but the wiring layer M2 includes not the wiring m21, but a wiring m22. The wiring m22 is similar to the wiring m21, but includes a plurality of pattern regions PR2 provided corresponding to the plurality of bit lines BL, in addition to the plurality of pattern regions PR1. In the illustrated example of FIG. 5, the pattern region PR1 is provided corresponding to the four adjacent memory blocks MB along the Y direction. The pattern region PR1 is provided at a position which overlaps with a part of two memory blocks MB among the corresponding four memory blocks MB, when viewed in the Z direction. A pattern region PR2 is provided corresponding to the four bit lines BL arranged in the X direction. The pattern region PR2 is provided at a position which overlaps with a part of the plurality of bit lines BL including the corresponding four bit lines BL, when viewed in the Z direction.

The pattern region PR2 includes a plurality of small pattern regions pr2 arranged in the X direction.

The plurality of small pattern regions pr2 are each provided with the pattern indicating "0," the pattern indicating "1," or a pattern indicating "2." In the illustrated example, the through via hole op in which the connection wiring cw is not provided refers to the pattern indicating "0," and the through via hole op in which one connection wiring cw is provided refers to the pattern indicating "1," and the through via hole op in which two connection wirings cw are provided refers to the pattern indicating "2." In the illustrated example, eleven-digit ternary numbers are represented by the eleven small pattern regions pr2, thereby forming a pattern representing the address of the bit line BL. The addresses of the bit lines BL represented in the pattern region PR2 different in position in the X direction are all different. Therefore, the patterns in the pattern region PR2 different in position in the X direction are all different.

According to such a configuration, the patterns in the pattern regions PR2 are all different according to position in the X direction. According to such a structure, when observing a bit line BL, it is possible to easily identify which bit line BL is the bit line BL being observed.

Further, in the second embodiment, the pattern region PR1 used to specify the memory block MB includes the pattern representing a binary number, and the pattern region PR2 used to specify the bit line BL includes the pattern representing a ternary number. Therefore, it is possible to easily identify the pattern region PR1 and the pattern region PR2. The base number is not limited to two or three, and N-base number, where N is an integer of two or more, can be used.

Third Embodiment

Figure 6:
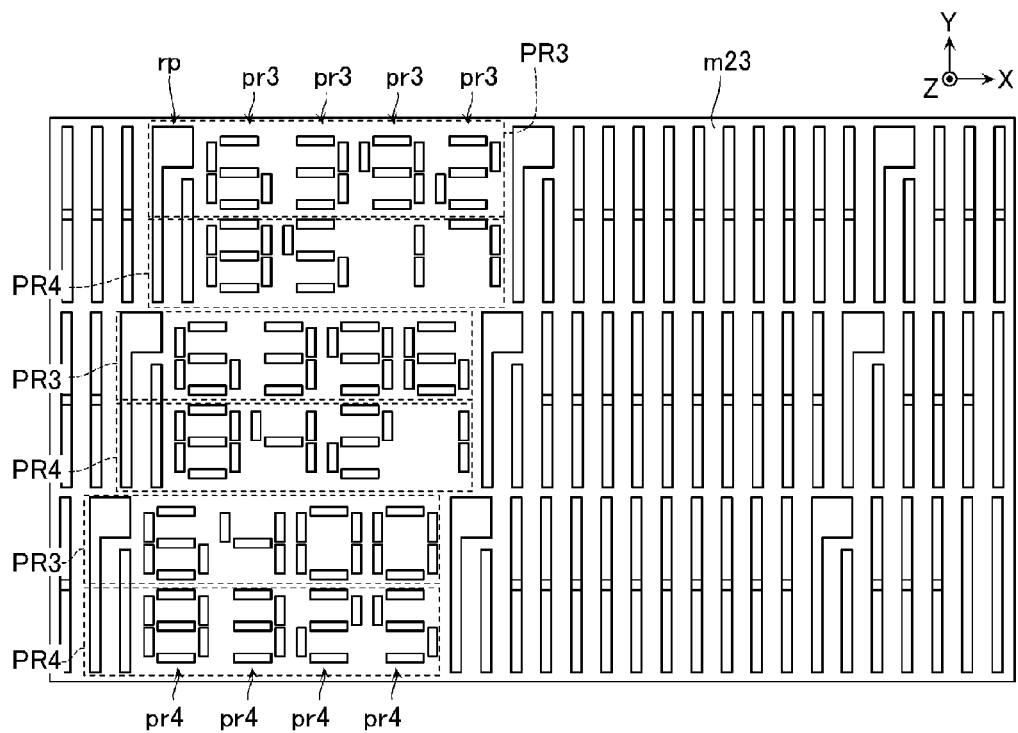
FIG. 6 illustrates a schematic plan view of a semiconductor chip according to a third embodiment.

FIG. 6 illustrates a plan view illustrating a configuration of a part of a semiconductor chip according to a third embodiment.

The semiconductor chip according to the third embodiment is basically configured in the same manner as the semiconductor chip according to the second embodiment, except that the wiring layer M2 includes a wiring m23 instead of the wiring m22. The wiring m23 is basically configured in the same manner as the wiring m22, except that it includes a plurality of pattern regions PR3 provided corresponding to the plurality of memory blocks MB and a plurality of pattern regions PR4 provided corresponding to the plurality of bit lines BL. In the illustrated example of FIG. 6, a pattern region PR3 is provided corresponding to the four adjacent memory blocks MB arranged in the Y direction. The pattern region PR3 is provided at a position which overlaps with a part of two memory blocks MB among the corresponding four memory blocks MB, when viewed in the Z direction. Further, in the illustrated example of FIG. 6, a pattern region PR4 is provided corresponding to the four bit lines BL arranged in the X direction. The pattern region PR4 is provided at a position which overlaps with a part of the bit lines BL including the corresponding four bit lines BL, when viewed in the Z direction.

The pattern region PR3 includes the small pattern region rp, and a plurality of small pattern regions pr3 arranged in the X direction. Further, the pattern region PR4 includes a plurality of small pattern regions pr4 arranged in the X direction.

The plurality of small pattern regions pr3 are provided with patterns indicating numerals "0" to "9." In the illustrated example, each small pattern region pr3 is provided with a seven-segment pattern for indicating each possible number 0 to 9. In the illustrated example, four-digit base 10 numbers are represented by the four small pattern regions pr3, thereby forming a pattern representing the address of the memory block MB. The addresses of the memory blocks MB represented in the pattern region PR3 are different according to position in the Y direction. Therefore, the patterns in the pattern region PR3 are all different for each position in the Y direction.

The plurality of small pattern regions pr4 are also provided with patterns indicating "0" to "9," in the same way as the plurality of small pattern regions pr3. The addresses of the bit lines BL represented in the pattern region PR4 are all different for each position along the X direction. Therefore, the patterns in the pattern region PR4 are all different for each position in the X direction.

Figure 7:
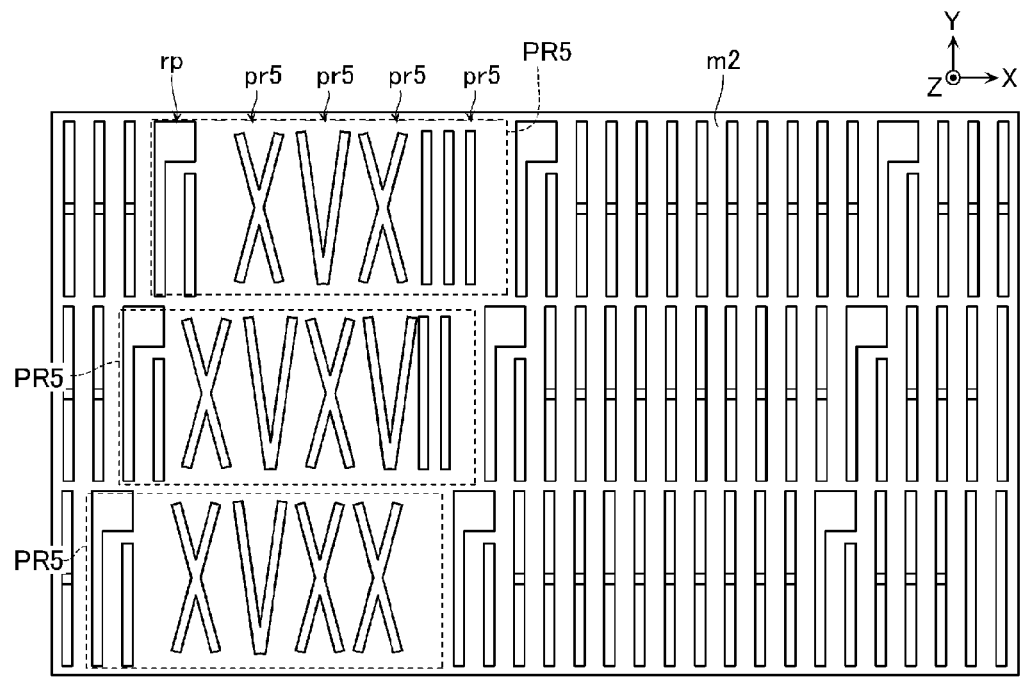
FIG. 7 illustrates a schematic plan view illustrating a modification of the third embodiment.
Figure 8:
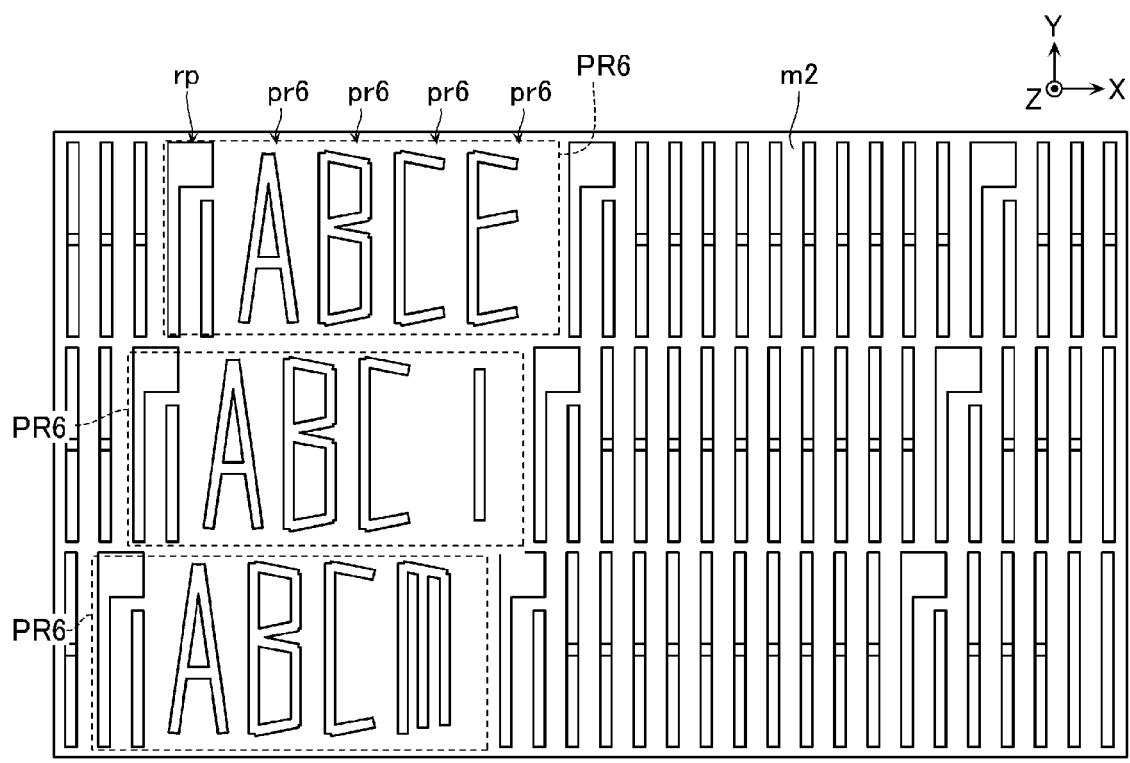
FIG. 8 illustrates a schematic plan view illustrating a modification of the third embodiment.

FIG. 6 depicts pattern regions PR3 that specify the memory block MB using seven-segment Arabic numeral patterns, and pattern regions PR4 that specify the bit line BL. However, the patterns in the small pattern regions may be changed. For example, as illustrated in FIG. 7, it is also possible to use pattern regions PR5 that specify the memory block MB by Roman numerals. As illustrated in FIG. 8, it is also possible to use pattern regions PR6 that specify the memory block MB by alphabetic designators. In general, it is also possible to specify the memory blocks MB or the bit lines BL by any other patterns capable of distinguishing one element from another of the same type.

Fourth Embodiment

Figure 9:
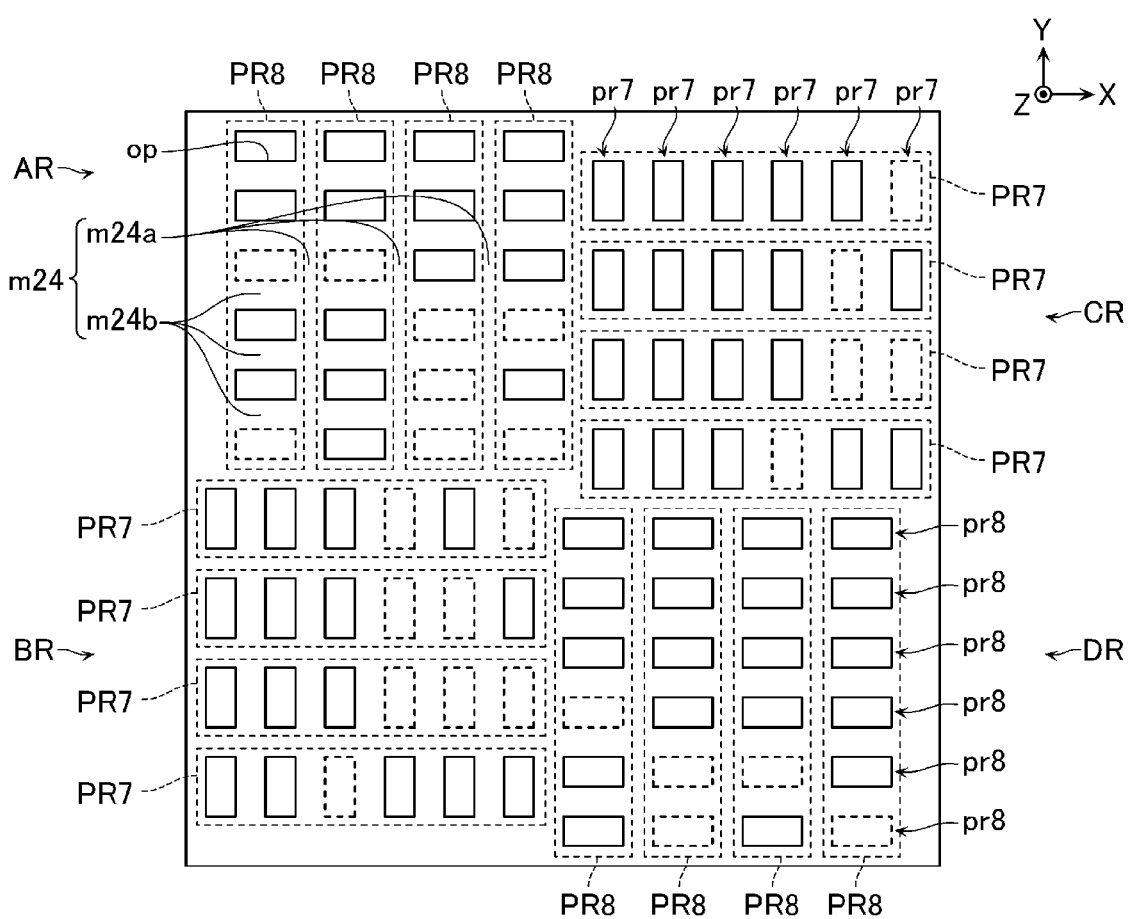
FIG. 9 illustrates a schematic plan view of a semiconductor chip according to a fourth embodiment.

FIG. 9 illustrates a plan view illustrating a configuration of a part of a semiconductor chip according to a fourth embodiment.

The semiconductor chip according to the fourth embodiment is basically configured in the same manner as the semiconductor chip according to the first embodiment, except that the wiring layer M2 includes a wiring m24 instead of the wiring m21.

In FIG. 9, four regions AR, BR, CR, and DR provided in the wiring m24 are illustrated. The region AR and the region BR are arranged in the Y direction. The region CR and the region DR are arranged in the Y direction. The region AR and the region CR are arranged in the X direction. The region BR and the region DR are arranged in the X direction. Further, the regions AR, BR, CR, and DR of the wiring m24 each include a plurality of wiring portions m24a that are arranged in the X direction and extend in the Y direction, and a plurality of wiring portions m24b that are arranged in the Y direction and extend in the X direction. The plurality of wiring portions m24a and m24b intersect each other to form substantially a net-like (grid-like) shape. In the regions AR and DR, the distance between the wiring portions m24a in the X direction is larger than the distance between the wiring portions m24b in the Y direction. That is, the width of the opening op in the X direction provided in the regions AR and DR is larger than the width of the through via hole op in the Y direction. In the regions BR and CR, the distance between the wirings m24a in the X direction is smaller than the distance between the wirings m24b in the Y direction. That is, the width of the opening op in the X direction provided in the regions BR and CR is larger than the width of the through via hole op in the Y direction.

Further, the regions BR and CR in the wiring m24 includes a plurality of pattern regions PR7 provided corresponding to one or more of the memory blocks MB. In the illustrated example of FIG. 9, a pattern region PR7 is provided at a position which overlaps with at least a part of the corresponding plurality of memory blocks MB, when viewed in the Z direction. Further, the regions AR and DR in the wiring m24 includes a plurality of pattern regions PR8 provided corresponding to the plurality of bit lines BL. In the illustrated example of FIG. 9, a pattern region PR8 is provided at a position which overlaps with at least a part of the corresponding plurality of bit lines BL, when viewed in the Z direction.

The pattern region PR7 includes a plurality of small pattern regions pr7 arranged in the X direction. Further, the pattern region PR8 includes a plurality of small pattern regions pr8 arranged in the Y direction.

The plurality of small pattern regions pr7 are each provided with a pattern indicating "0" or a pattern indicating "1." In the illustrated example, the region(s) in which the through via hole op is provided provides a pattern indicating "0," and the region(s) in which the through via hole op is not provided provides a pattern indicating "1." That is, the 0/1 values are coded by placement (s) of the via holes op. In the illustrated example of FIG. 9, the binary numbers are represented by the plurality of small pattern regions pr7 (pattern of dashed regions pr7 and solid regions pr7), thereby forming a pattern representing the address of the memory block MB. The addresses of the memory blocks MB represented by the pattern regions PR7 are all different along the Y direction. Therefore, the patterns in the pattern regions PR7 are all different.

The plurality of small pattern regions pr8 are also provided with a pattern indicating "0" or "1," in a similar way as the plurality of small pattern regions pr7. The addresses of the bit lines BL represented in the pattern region PR8 are all different along the X direction. Therefore, the patterns in the pattern regions PR8 are all different.

According to such a configuration, it is possible to reduce the stress difference in the wiring m24 between the X direction and the Y direction.

The width or the distance or the like of the wiring portions m24a and m24b or the like that make up the wiring m24 may be varied or changed.

Fifth Embodiment

Figure 10:
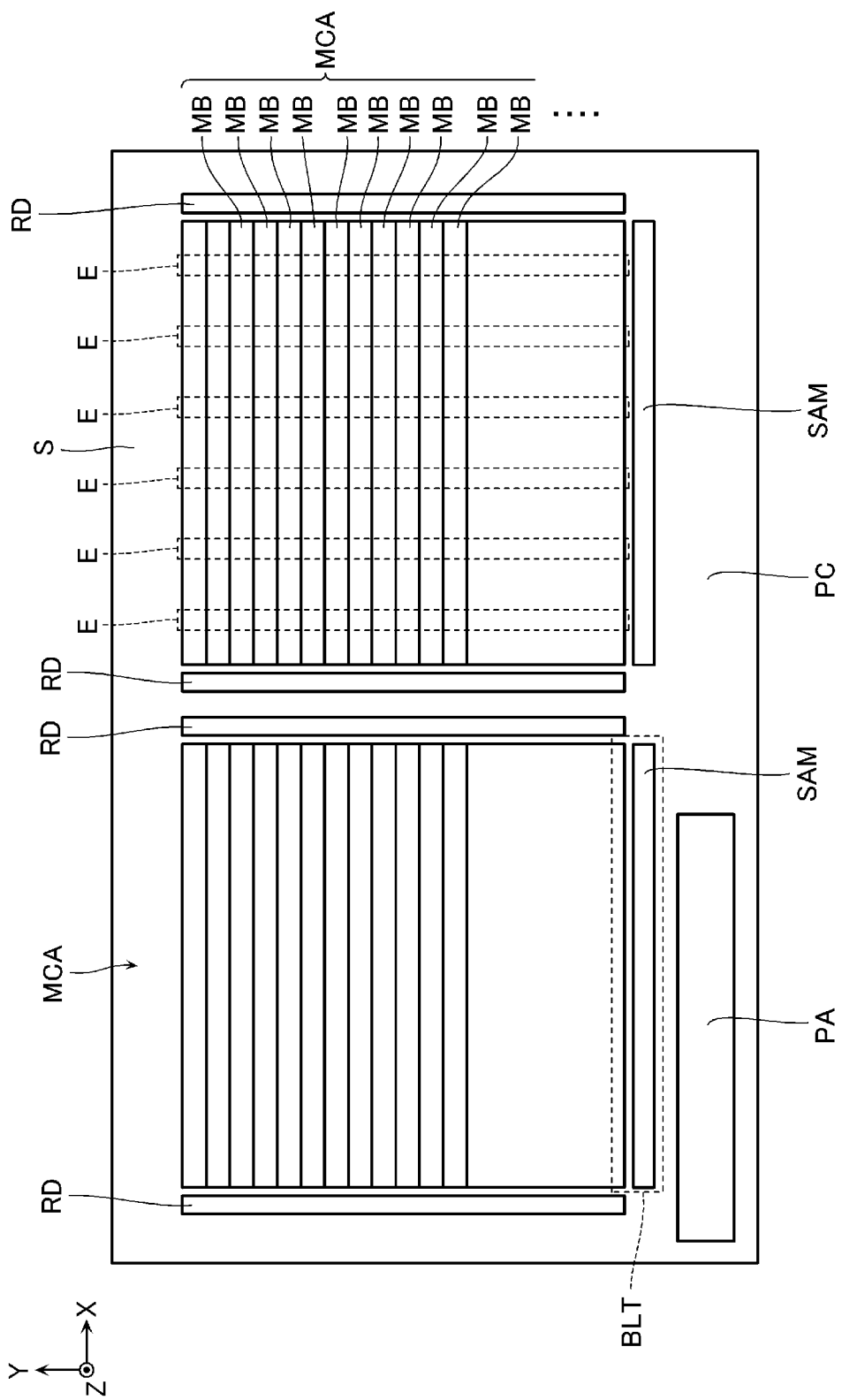
FIG. 10 illustrates a schematic plan view of a semiconductor chip according to a fifth embodiment.

FIG. 10 illustrates a schematic plan view of a semiconductor chip according to a fifth embodiment. The semiconductor chip according to the fifth embodiment is basically configured in the same manner as the semiconductor chip according to the first embodiment. However, in the semiconductor chip according to the fifth embodiment, the memory cell array MCA is provided above the substrate S, and a bit line connecting region BLT is provided in a region that overlaps the sense amplifier module SAM. Further, a plurality of wiring connecting regions E that are provided in the X direction and extend in the Y direction are provided in the region of the memory cell array MCA.

Figure 11:
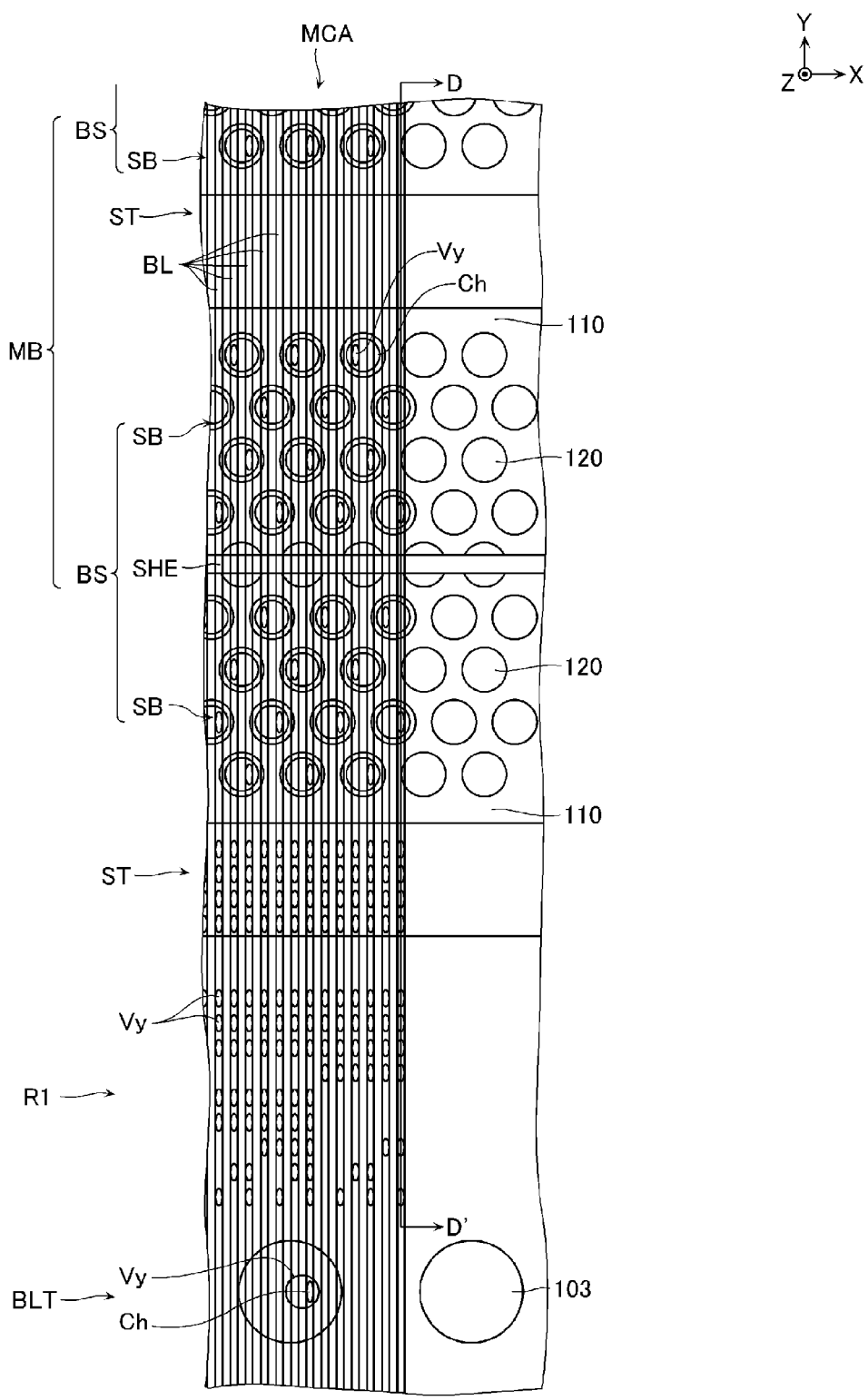
FIG. 11 illustrates an enlarged view of a portion of FIG. 10.

FIG. 11 illustrates an enlarged view of a part of FIG. 10. In FIG. 11, the configuration of a part of the bit line connecting region BLT and a part of the memory cell array MCA. As illustrated, the bit line BL extends in the Y direction from the memory cell array MCA to the bit line connecting region BLT. In the memory cell array MCA, the bit line BL is connected to the semiconductor layer 120 via the contact Vy and the contact Ch. In the bit line connecting region BLT, a bit line BL is connected to the sense amplifier module SAM (FIG. 10) via the contact Vy, the contact Ch, and the contact 103. Further, in a region R1 between the memory cell array MCA and the bit line connecting region BLT, a plurality of contacts Vy are connected to each bit line BL.

Figure 12:
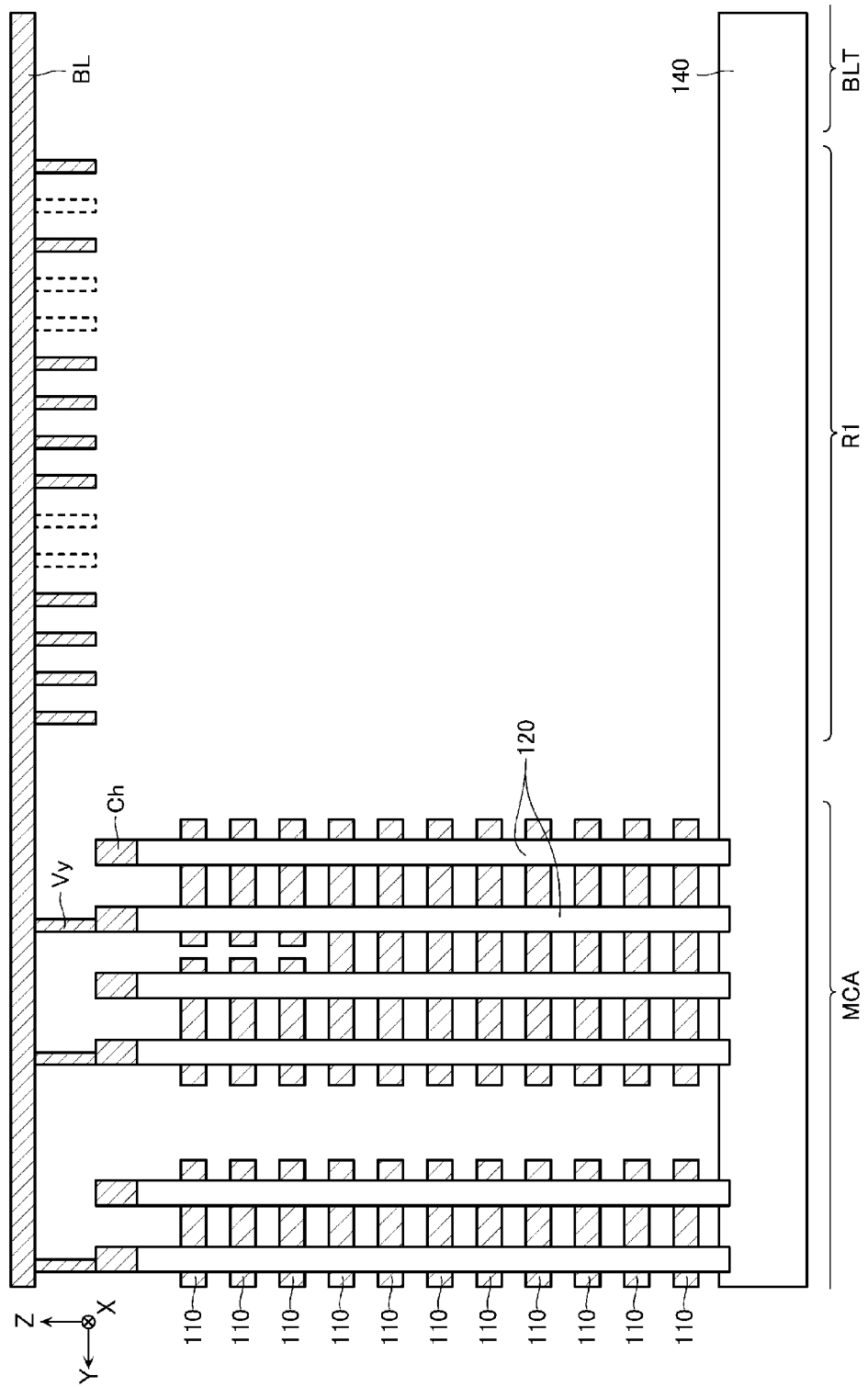
FIG. 12 illustrates a schematic cross-sectional view corresponding to line D-D' in FIG. 11.

FIG. 12 illustrates a schematic cross-sectional view of the structure illustrated in FIG. 11 cut along line D-D', and viewed in the direction of the arrow. As illustrated in FIG. 12, in the region R1 between the memory cell array MCA and the bit line connecting region BLT, the contact Vy is connected to the bit line BL. However, in the region R1, the bit line BL is not connected to other wirings. In FIG. 12, a wiring 140 connected to the lower end of the plurality of semiconductor layers 120 is illustrated. The wiring 140 is provided above the upper surface of the substrate S.

Figure 13:
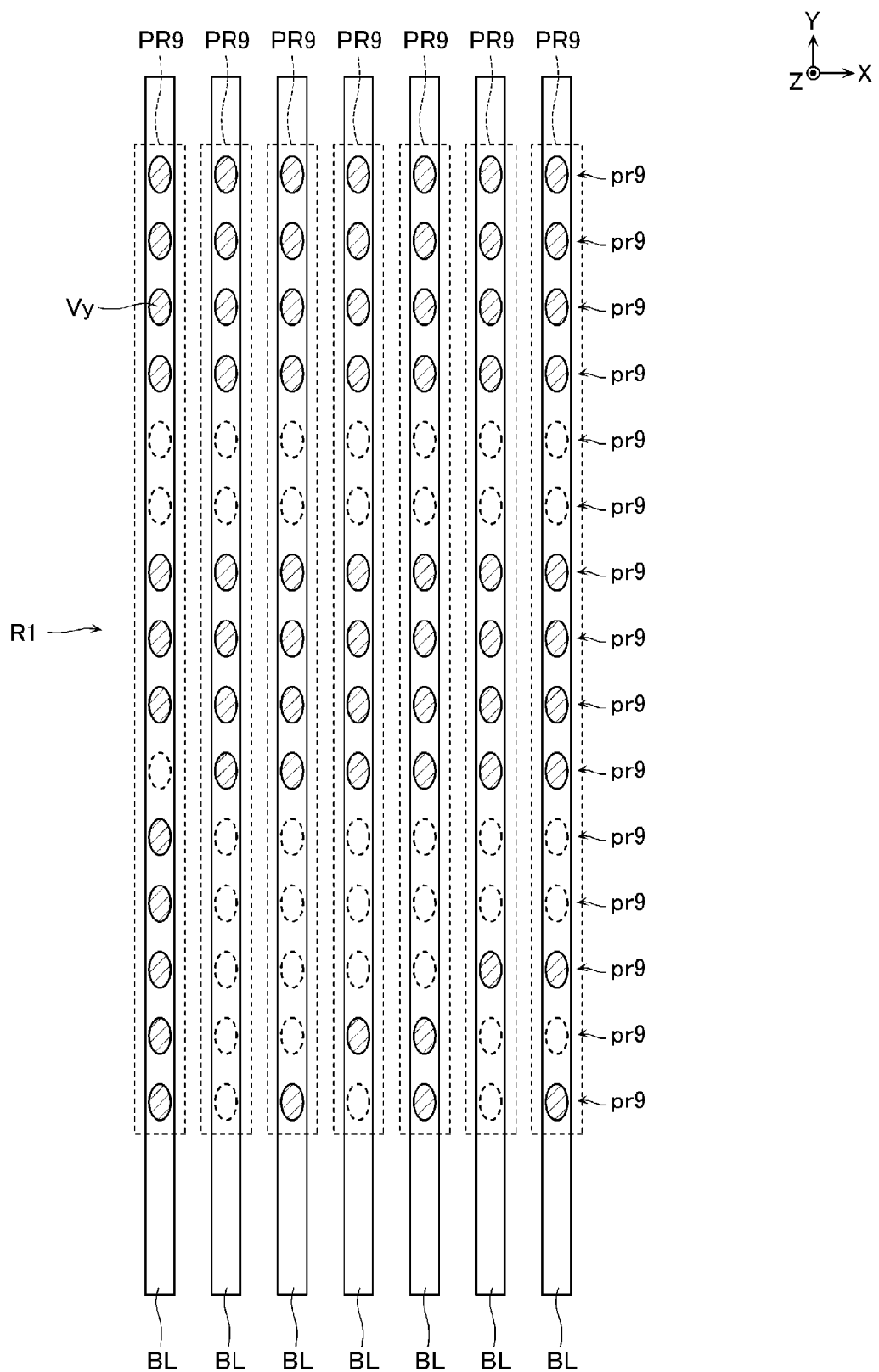
FIG. 13 illustrates an enlarged view of a part of FIG. 11.

FIG. 13 illustrates an enlarged plan view of a region of FIG. 11, and illustrates the bit lines BL and the contacts Vy in the region R1 between the memory cell array MCA and the bit line connecting region BLT.

In the fifth embodiment, the wiring layer including the contacts Vy includes a plurality of pattern regions PR9 provided corresponding to each bit line BL. In the illustrated example of FIG. 13, a pattern region PR9 is provided for every one of the bit lines BL. However, the pattern region PR9 may also be provided, for example, for every other bit line or for every five bit lines, or more broadly only for some of the bit lines BL among the plurality of bit lines BL.

The pattern region PR9 includes a plurality of small pattern regions pr9 arranged in a direction along the bit line BL. The plurality of small pattern regions pr9 are each provided with a pattern indicating "0" or a pattern indicating "1." In the illustrated example of FIG. 13, a region in which the contact Vy is not provided indicates "0," and a region in which the contact Vy is provided indicates "1." In the illustrated example of FIG. 13, fifteen-digit binary numbers can be represented by the fifteen small pattern regions pr9, thereby forming a pattern representing the address of the bit line BL. The addresses of the bit lines BL represented in a pattern region PR9 are all different along the X direction. Therefore, the patterns in the pattern region PR9 are all different from each other in the X direction.

In such a configuration, the wiring layer including the contact Vy is located below the wiring layers M0, M1, and M2 described above, and is close to the memory cell array MCA. For that reason, even when wiring layers M0, M1, and M2 have been removed at the time of analyzing or the like, the bit lines BL may be easily identified.

Further, the width of the contact Vy in the X direction may be approximately the same as the width of the bit line BL in the X direction. Therefore, the pattern corresponding to the bit line BL is easily formed by the contact Vy. Such a configuration may be easily implemented by changing the pattern of the contact Vy.

The semiconductor chip according to the fifth embodiment may or may not include, for example, the wiring m21, the wiring m22, or the wiring m23 according to the first to third embodiments.

Furthermore, in the fifth embodiment, in the region R1 between the memory cell array MCA and the bit line connecting region BLT, a plurality of pattern regions PR9 arranged in the X direction are provided. However, the plurality of pattern regions PR9 may be provided in a region other than such a region R1.

Other Embodiments

In the above, descriptions have been made on the first to fifth embodiments. However, the above descriptions are merely illustrative and specific configurations or the like may be properly changed.

For example, in the above embodiments, descriptions have been made for examples in which each memory block can be specified from all the memory blocks MB provided in the semiconductor chip, or every bit line BL can be uniquely specified from all the bit lines BL, by using only the different pattern regions (PR1 to PR9). However, it is also possible to adopt a configuration in which, instead of specifying each memory block MB or bit line BL by only the pattern regions (PR1 to PR9), a memory block MB or a bit line BL can be specified using other information.

For example, as illustrated in FIG. 1, when the semiconductor chip includes relatively few memory cell arrays MCA, it may be relatively easy to specify the memory cell array MCA including a particular memory block MB or bit line BL. In such a case, it is possible to omit the information that would be used to specify the memory cell array MCA from the pattern regions (PR1 to PR9).

Furthermore, for example, as illustrated in FIG. 10, when a plurality of wiring connecting regions E are provided in the memory cell array MCA, the memory cell array MCA is divided into a plurality of regions by the plurality of wiring connecting regions E that extend in the Y direction, and the plurality of bit lines BL are provided in these divided regions, respectively. In such a case, it may be relatively easy to specify the divided region including a bit line BL. In such a case, it is possible to omit the information that specifies the divided region from certain pattern regions (e.g., PR2, PR4, PR8, and PR9).

In the first embodiment to the fourth embodiment, a memory cell array MCA is provided on the surface of the substrate S, and in the fifth embodiment, a memory cell array MCA is separated from the substrate S. However, memory cell arrays MCA according to the first embodiment to the fourth embodiment may also be separated from the substrate S, and memory cell arrays MCA according to the fifth embodiment may be provided on the surface of the substrate S.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor chip, comprising:
a memory cell array including a plurality of blocks arranged in a first direction along a surface of the semiconductor chip; and
a wiring layer including three or more first pattern regions at different positions along the first direction, each of the three or more first pattern regions including a different pattern that represents an address of a corresponding one of the blocks.

2. The semiconductor chip according to claim 1, wherein each of the three or more first pattern regions includes a plurality of small pattern regions each of which corresponds to one of a plurality of digits of a N-base number, where N is an integer of two or more.

3. The semiconductor chip according to claim 2, wherein the N-base number corresponds to an address of a block.

4. The semiconductor chip according to claim 2, wherein the N-base number corresponds to an address of a bit line.

5. The semiconductor chip according to claim 2, wherein N is two.

6. The semiconductor chip according to claim 1, wherein each of the three or more first pattern regions includes numerical character patterns corresponding to an address of one of the blocks corresponding to the first pattern region.

7. The semiconductor chip according to claim 1, wherein each of the three or more first pattern regions includes numerical character patterns corresponding to an address of a bit line corresponding to the first pattern region.

8. The semiconductor chip according to claim 1, wherein each of the three or more first pattern regions includes alphabetical character patterns corresponding to an address of one of the blocks corresponding to the first pattern region.

9. The semiconductor chip according to claim 1, wherein each of the three or more first pattern regions includes alphabetical character patterns corresponding to an address of a bit line corresponding to the first pattern region.

10. A semiconductor chip, comprising:
a memory cell array including a plurality of blocks arranged in a first direction along a surface of the semiconductor chip; and
a wiring layer including a plurality of first pattern regions at different positions along the first direction, each first pattern region including a different pattern corresponding to one or more of the blocks, wherein the wiring layer is provided at a position overlapping the memory cell array.

11. A semiconductor chip, comprising:
a memory cell array including a plurality of blocks arranged in a first direction along a surface of the semiconductor chip;
a wiring layer including a plurality of first pattern regions at different positions along the first direction, each first pattern region including a different pattern corresponding to one or more of the blocks; and
a plurality of wirings extending in the first direction and arranged in a second direction along the surface of the semiconductor chip, the second direction intersecting with the first direction, wherein
the plurality of wirings each include a plurality of second pattern regions that are different at positions along the second direction, the plurality of second pattern regions including patterns different from each other.

12. The semiconductor chip according to claim 11, wherein each of the second pattern regions includes a plurality of small pattern regions each of which corresponds to one of a plurality of digits of a binary number.

13. The semiconductor chip according to claim 12, wherein
the first pattern regions corresponds to an address of one of the blocks corresponding to the first pattern region, and
the second pattern regions corresponds to an address of one of the wirings corresponding to the second pattern region.

14. The semiconductor chip according to claim 11, wherein the patterns included in the plurality of second pattern regions comprises a plurality of inter-level contacts.

15. The semiconductor chip according to claim 11, wherein the plurality of wirings are bit lines.

16. A semiconductor chip, comprising:
a memory cell array including a plurality of blocks arranged in a first direction; and
a plurality of wirings extending in the first direction and arranged in a second direction intersecting the first direction, wherein
wirings in the plurality of wirings each include a plurality of pattern regions that are different at positions in the second direction, the plurality of pattern regions each including identification patterns that are different from each other.

17. The semiconductor chip according to claim 16, wherein identification patterns of each of the pattern regions represents N-base number information, where N is an integer of more than or equal to 2, and the pattern regions each including a plurality of small pattern regions that corresponds to a digit of the N-base number information of the respective pattern region.

18. The semiconductor chip according to claim 17, wherein the N-base number information of each of the pattern regions corresponds to an address of a wiring in the plurality of wirings that corresponding to the respective pattern region.

19. The semiconductor chip according to claim 16, wherein the patterns included in the plurality of pattern regions comprise inter-level contacts.

20. The semiconductor chip according to claim 16, wherein the plurality of wirings are bit lines.

* * * * *